United States Patent
He et al.

(10) Patent No.: US 10,481,916 B2
(45) Date of Patent: Nov. 19, 2019

(54) COMPUTER DEVICE AND MEMORY STARTUP METHOD OF COMPUTER DEVICE

(71) Applicant: Huawei Technologies Co., Ltd., Shenzhen (CN)

(72) Inventors: Jian He, Shenzhen (CN); Xiancai Li, Shenzhen (CN); Xiaoke Ni, Shenzhen (CN); Yimin Yao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/443,452

(22) Filed: Feb. 27, 2017

(65) Prior Publication Data

US 2017/0168849 A1 Jun. 15, 2017

Related U.S. Application Data

(63) Continuation of application No. PCT/CN2014/090708, filed on Nov. 10, 2014.

(51) Int. Cl.
*G06F 9/44* (2018.01)
*G11C 29/14* (2006.01)
(Continued)

(52) U.S. Cl.
CPC .......... *G06F 9/4406* (2013.01); *G06F 9/4401* (2013.01); *G06F 11/221* (2013.01);
(Continued)

(58) Field of Classification Search
CPC .. G06F 9/4406; G06F 11/221; G06F 11/2247; G06F 11/27; G11C 29/12
See application file for complete search history.

(56) References Cited

U.S. PATENT DOCUMENTS 6,374,353 B1* 4/2002 Settsu ................ G06F 9/4406
713/2
2002/0083369 A1* 6/2002 Schelling ............ G06F 11/2284
714/36
(Continued)

FOREIGN PATENT DOCUMENTS

CN 1545654 A 11/2004
CN 1900908 A 1/2007
(Continued)

OTHER PUBLICATIONS

Foreign Communication From a Counterpart Application, PCT Application No. PCT/CN2014/090708, English Translation of International Search Report dated May 4, 2015, 2 pages.
(Continued)

*Primary Examiner* — Jaweed A Abbaszadeh
*Assistant Examiner* — Gayathri Sampath
(74) *Attorney, Agent, or Firm* — Conley Rose, P.C.

(57) ABSTRACT

A computer device and a memory startup method of a computer are provided, where a basic input/output system initializes only a first part of memory in a memory initialization phase after a computer is powered on and started, so that an operating system can be started, and after the operating system is started, the basic input/output system continues to initialize memory that is not initialized in the computer, so that, in a startup phase, the computer can start the operating system without needing to wait until all memory has been initialized; therefore, a time from being started to entering the operating system is reduced for the computer, and a user can quickly enter the operating system to perform an operation, thereby improving user experience.

17 Claims, 6 Drawing Sheets

(51) Int. Cl.
*G11C 29/08* (2006.01)
*G11C 29/12* (2006.01)
*G06F 11/27* (2006.01)
*G06F 11/22* (2006.01)
*G11C 29/04* (2006.01)
*G11C 7/20* (2006.01)
*G06F 9/4401* (2018.01)

(52) U.S. Cl.
CPC .......... *G06F 11/2247* (2013.01); *G06F 11/27* (2013.01); *G11C 29/08* (2013.01); *G11C 29/12* (2013.01); *G11C 29/14* (2013.01); *G06F 9/4411* (2013.01); *G11C 7/20* (2013.01); *G11C 2029/0407* (2013.01); *G11C 2207/2254* (2013.01)

(56) References Cited

U.S. PATENT DOCUMENTS

| | | | | |
|---|---|---|---|---|
| 2003/0185058 | A1* | 10/2003 | LeClerg | G06F 13/1668 365/189.16 |
| 2004/0158701 | A1 | 8/2004 | Merkin | |
| 2005/0216721 | A1* | 9/2005 | Zimmer | G06F 9/4401 713/2 |
| 2007/0214347 | A1 | 9/2007 | Rothman et al. | |
| 2008/0159059 | A1* | 7/2008 | Moyer | G06F 11/1008 365/236 |
| 2008/0162858 | A1* | 7/2008 | Moyer | G06F 11/1008 711/170 |
| 2009/0235036 | A1 | 9/2009 | Ro et al. | |
| 2009/0287900 | A1* | 11/2009 | Kirscht | G06F 9/4406 711/173 |
| 2010/0042629 | A1* | 2/2010 | Fukatani | G06F 11/2289 709/212 |
| 2011/0131399 | A1* | 6/2011 | Sainath | G06F 11/106 713/2 |
| 2013/0097412 | A1* | 4/2013 | Dasari | G06F 9/4405 713/2 |

FOREIGN PATENT DOCUMENTS

| | | |
|---|---|---|
| CN | 1959636 A | 5/2007 |
| CN | 103455436 A | 12/2013 |
| CN | 103605591 A | 2/2014 |
| CN | 103942069 A | 7/2014 |

OTHER PUBLICATIONS

Foreign Communication From a Counterpart Application, PCT Application No. PCT/CN2014/090708, International Search Report, English translation, dated May 4, 2015, 2 pages.

Foreign Communication From a Counterpart Application, PCT Application No. PCT/CN2014/090708, Written Opinion, dated May 4, 2015, 3 pages.

Foreign Communication From a Counterpart Application, PCT Application No. PCT/CN2014/090708, Written Opinion, English translation, dated May 4, 2015, 5 pages.

Foreign Communication From a Counterpart Application, European Application No. 14905730.9, Extended European Search Report dated Jul. 26, 2017, 7 pages.

Machine Translation and Abstract of Chinese Publication No. CN1900908, Jan. 24, 2007, 6 pages.

Machine Translation and Abstract of Chinese Publication No. CN103455436, Dec. 18, 2013, 21 pages.

* cited by examiner

COMPUTER DEVICE AND MEMORY STARTUP METHOD OF COMPUTER DEVICE

CROSS-REFERENCE TO RELATED APPLICATIONS

This application is a continuation of International Application No. PCT/CN2014/090708, filed on Nov. 10, 2014, the disclosure of which is hereby incorporated by reference in its entirety.

TECHNICAL FIELD

The present disclosure relates to the field of information technologies, and in particular, to a computer device and a memory startup method.

BACKGROUND

A memory is one of important components in a computer, and all programs in the computer run in the memory. A function of the memory is temporarily storing computing data in a central processing unit (CPU), and data exchanged with an external storage device such as a hard disk. As long as the computer is running, the CPU copies data that needs to be operated to the memory for operation. After the operation is completed, the CPU then sends a result out, and running of the memory also ensures stable running of the computer.

With the development of CPU technologies, increase in memory capacity, and reduction in price, the computer begins to use more memory to improve overall performance of the computer. Consequently, during system startup, a time of memory training and self-testing also increases linearly. When a memory of a terabyte (TB) level is used, in a conventional processing manner, training and self-testing operations are started after all memory of a system is completely initialized in a startup phase, and a time consumed by self-testing may increase to more than ten minutes, causing startup of the computer to be excessively slow, thereby affecting user experience.

SUMMARY

Embodiments of the present disclosure provide a computer device and a memory startup method of a computer, to resolve a problem in the prior art that a memory initialization time of a computer device is excessively long and a waiting time for a user is excessively long.

A first aspect of the embodiments of the present disclosure provides a memory startup method of a computer, including initializing, by a basic input/output system of the computer, only a first part of memory of the computer in a memory initialization phase when the computer is powered on and started, where the first part of the memory is a preset memory part of the memory of the computer, and the first part of the memory that is initialized can satisfy a memory requirement for startup of an operating system that runs in the computer; and continuing to initialize, by the basic input/output system, memory, except the first part of the memory, of the memory of the computer after the operating system of the computer is started, and notifying the operating system of the computer of the initialized memory except the first part of the memory, so that the operating system of the computer further initializes the memory, except the first part of the memory, of the memory of the computer, and adds the memory that is further initialized to available memory of the operating system.

With reference to the first aspect, in a first possible implementation manner of the first aspect, the further initializing, by the operating system of the computer, the memory, except the first part of the memory, of the memory of the computer includes starting, by the operating system of the computer, memory initialization of an operating system phase in a manner of a kernel thread or a kernel driver, and adding the initialized memory, except the first part of the memory, of the memory of the computer to the available memory of the operating system.

With reference to the first aspect, in a second possible implementation manner of the first aspect, the method further includes, after the operating system of the computer is started, further initializing, by the operating system of the computer, memory initialized by the basic input/output system, and adding the first part of the memory that is further initialized to the available memory of the operating system.

With reference to the first aspect, in a third possible implementation manner of the first aspect, a size of the first part of the memory is set in a manner of a hardware signal or a configuration file, where the manner of the hardware signal is to set the size of the first part of the memory according to a level signal output by hardware and a preset relationship between the level signal and a memory size; the manner of the configuration file is to add a configuration option to the basic input/output system and determine the size of the first part of the memory according to a received memory size that is input in the configuration option.

With reference to the first aspect, in a fourth possible implementation manner of the first aspect, a size of the first part of the memory is determined using a preset memory slot, and a size of memory that corresponds to a memory slot powered on in a startup phase of the basic input/output system is the size of the first part of the memory.

With reference to the first aspect, in a fifth possible implementation manner of the first aspect, the further initializing, by the operating system, the memory, except the first part of the memory, initialized by the basic input/output system includes determining, by the operating system, whether the memory that is further initialized satisfies a memory size required by a to-be-started process, and when a size of the memory that is further initialized does not satisfy the memory size required by the to-be-started process, waiting for a preset time; and when the size of the memory that is further initialized satisfies a requirement of the to-be-started process, starting, by the operating system, the to-be-started process.

With reference to the first aspect, in a sixth possible implementation manner of the first aspect, the method further includes, when the size of the memory that is further initialized satisfies memory required by startup of two or more processes, preferably starting a process with a higher priority.

With reference to the first aspect, in a seventh possible implementation manner of the first aspect, the operating system of the computer is a Linux® operating system, and correspondingly, the initializing, by the operating system of the computer, the first part of the memory in the memory of the computer includes initializing, by the operating system of the computer, the memory, the first part of the memory in the memory of the computer using a main function and a start_kernel function, where the operating system of the computer detects, using the main function, memory that is initialized by the basic input/output system, and writes the memory into a global e820 table; and the start_kernel function is used to initialize a memory management area.

According to a second aspect, the embodiments of the present disclosure further provide a computer device, including a memory and a central processing unit, and a basic input/output system and an operating system that run in the computer device, where the basic input/output system is configured to initialize only a first part of memory of the computer device in a memory initialization phase when the computer device is powered on and started, where the first part of the memory is a preset memory part of the memory of the computer device, and the first part of the memory that is initialized can satisfy a memory requirement for startup of an operating system that runs in the computer device; and continue to initialize memory, except the first part of the memory, of the memory of the computer after the operating system is started, and notify the operating system of the initialized memory except the first part of the memory; and the operating system is configured to further initialize the memory, except the first part of the memory, of the memory of the computer device, and add the memory that is further initialized to available memory of the operating system.

With reference to the second aspect, in a first possible implementation manner of the second aspect, the further initializing, by the operating system, the memory, except the first part of the memory, of the memory of the computer includes starting, by the operating system, memory initialization of an operating system phase in a manner of a kernel thread or a kernel driver, and adding the initialized memory, except the first part of the memory, of the memory of the computer to the available memory of the operating system.

With reference to the second aspect, in a second possible implementation manner of the second aspect, the operating system is further configured to, after being started, further initialize the first part of the memory that is initialized by the basic input/output system, and add the first part of the memory that is further initialized to the available memory of the operating system.

With reference to the second aspect, in a third possible implementation manner of the second aspect, a size of the first part of the memory is set in a manner of a hardware signal or a configuration file, where the manner of the hardware signal is to set the size of the first part of the memory according to a level signal output by hardware and a preset relationship between the level signal and a memory size; the manner of the configuration file is to add a configuration option to the basic input/output system and determine the size of the first part of the memory according to a received memory size that is input in the configuration option.

With reference to the second aspect, in a fourth possible implementation manner of the second aspect, a size of the first part of the memory is determined using a preset memory slot, and a size of memory that corresponds to a memory slot powered on in a program startup phase of the basic input/output system is the size of the first part of the memory.

With reference to the second aspect, in a fifth possible implementation manner of the second aspect, the further initializing, by the operating system, the memory, except the first part of the memory, initialized by the basic input/output system includes determining, by the operating system, whether the memory that is further initialized satisfies a memory size required by a to-be-started process, and when a size of the memory that is further initialized does not satisfy the memory size required by the to-be-started process, waiting for a preset time; and when the size of the memory that is further initialized satisfies a requirement of the to-be-started process, starting the to-be-started process.

With reference to the second aspect, in a sixth possible implementation manner of the second aspect, when the operating system further initializes the memory, except the first part of the memory, initialized by the basic input/output system, if the size of the memory that is further initialized satisfies memory required by startup of two or more processes, a process with a higher priority is preferably started.

With reference to the second aspect, in a seventh possible implementation manner of the second aspect, the operating system is a Linux operating system, and correspondingly, the initializing, by the operating system, the memory, except the first part of the memory, of the memory of the computer includes initializing, by the operating system, the memory, the first part of the memory in the memory of the computer using a main function and a start_kernel function, where the operating system detects, using the main function, memory that is initialized by a program of the basic input/output system, and writes the memory into a global e820 table; and the start_kernel function is used to initialize a memory management area.

The embodiments of the present disclosure provide the computer device and the memory startup method of a computer, where a basic input/output system initializes only a first part of memory in a memory initialization phase after a computer is powered on and started, so that an operating system can be started; and after the operating system is started, the basic input/output system continues to initialize memory that is not initialized in the computer, so that, in a startup phase, the computer can start the operating system without needing to wait until all memory has been initialized; therefore, a time from being started to entering the operating system is reduced for the computer, and a user can quickly enter the operating system to perform an operation, thereby improving user experience.

BRIEF DESCRIPTION OF DRAWINGS

To describe the technical solutions in the embodiments of the present disclosure or in the prior art more clearly, the following briefly introduces the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

After a computer device is powered on and started, the computer device first enters a basic input/output system running phase, and in this phase, operations such as self-testing and initialization of system hardware, program service startup, allocation of interruption resources, and OS booting are mainly completed. After running to a menu of system startup options, the basic input/output system jumps to an operating system boot program according to a current configuration, and the operating system boot program boots up an operating system (OS). When startup of the OS begins, the OS takes over control of a CPU, and the OS continues to initialize hardware, services and the like of a system, and finally runs to a user login interface.

An embodiment of the present disclosure provides a memory startup method of a computer. In a startup procedure, a basic input/output system initializes only a part of memory, and after an operating system is started, the basic input/output system continues to initialize memory in a background, so that the computer can enter an interface of the operating system quickly, and therefore a user can quickly enter the operating system without needing to wait for an excessively long startup time, thereby implementing an operation, customized setting, and the like on the operating system.

Figure 1:
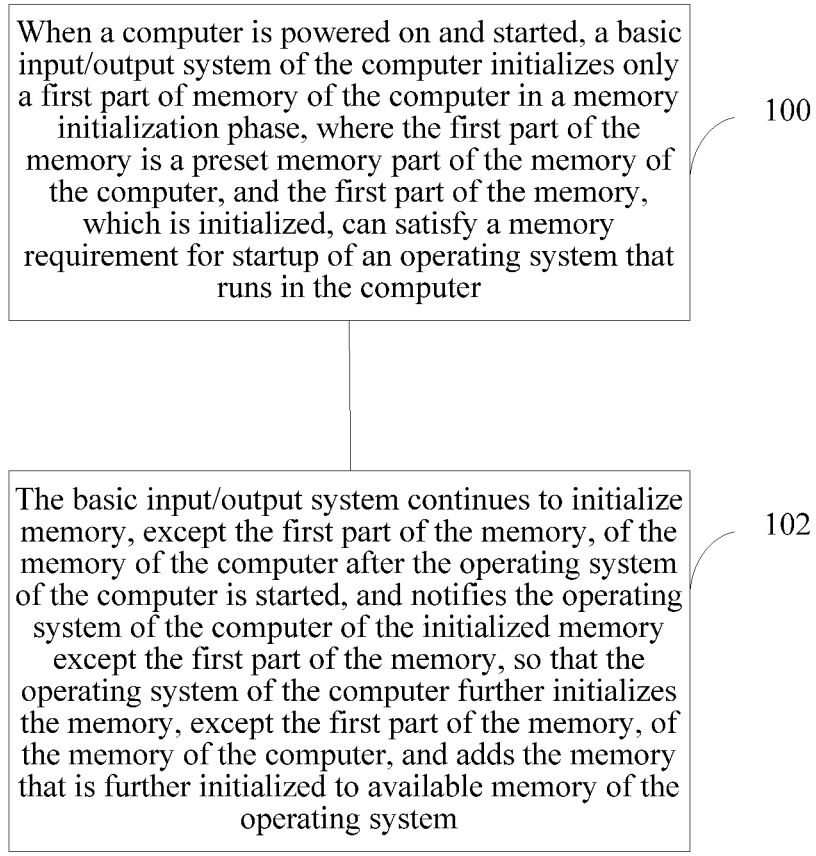
FIG. 1 is a schematic flowchart of a memory startup method of a computer according to an embodiment of the present disclosure.

Referring to FIG. 1, FIG. 1 is a schematic flowchart of a memory startup method of a computer according to an embodiment of the present disclosure, including the following steps.

Step 100: When the computer is powered on and started, a basic input/output system of the computer initializes only a first part of memory of the computer in a memory initialization phase, where the first part of the memory is a preset memory part of the memory of the computer, and the first part of the memory that is initialized can satisfy a memory requirement for startup of an operating system that runs in the computer.

Step 102: The basic input/output system continues to initialize memory, except the first part of the memory, of the memory of the computer after the operating system of the computer is started, and notifies the operating system of the computer of the initialized memory except the first part of the memory, so that the operating system of the computer further initializes the memory, except the first part of the memory, of the memory of the computer, and adds the memory that is further initialized to available memory of the operating system.

In the foregoing memory startup method of a computer, after a computer is powered on and started, a basic input/output system initializes only a first part of memory in a memory initialization phase, so that an operating system can be started, and after the operating system is started, the basic input/output system continues to initialize memory that is not initialized in the computer, so that, in a startup phase, the computer can start the operating system without needing to wait until all memory has been initialized; therefore, a time from being started to entering the operating system is reduced for the computer, and a user can quickly enter the operating system to perform an operation, thereby improving user experience.

In this embodiment of the present disclosure, the first part of the memory may be memory that satisfies basic requirements of an operating system. The basic operating system is an operating system that includes no additional functions (such as a web browser), as long as an operating system interface can be entered, and a basic operation of the operating system, or an operation having a specific function and preset by a computer user, is implemented, so that a time from being started to entering the operating system is reduced for the computer, thereby improving user experience.

As an optional implementation manner, in step 102, the further initializing, by the operating system of the computer, the memory, except the first part of the memory, of the memory of the computer includes starting, by the operating system of the computer, memory initialization of an operating system phase in a manner of a kernel thread or a kernel driver, and adding the initialized memory, except the first part of the memory, of the memory of the computer to the available memory of the operating system.

In the foregoing method, in the manner of the kernel thread or the kernel driver, after the operating system is started, the operating system further initializes the memory initialized by the basic input/output system, so that the memory that is further initialized can be used by the operating system, and memory requirements of some processes or additional functions are satisfied after the operating system is started.

In a startup procedure of the operating system of the computer, memory required for startup of the operating system is the first part of the memory initialized by the basic input/output system. Before the operating system uses the first part of the memory, the operating system needs to initialize the first part of the memory, and only after the first part of the memory can be used by the operating system, startup of the operating system is finally completed. When the operating system of the computer is a Linux operating system, the memory, except the first part of the memory, of the memory of the computer may be initialized by a main function and a start_kernel function in the Linux operating system, where the Linux operating system detects, using the main function, memory that is initialized by the basic input/output system, and writes the memory into a global e820 table; and the start_kernel function is used to initialize a memory management area.

As an optional manner, a size of the first part of the memory is set in a manner of a hardware signal or a configuration file, where the manner of the hardware signal is to set the size of the first part of the memory according to a level signal output by hardware and a preset relationship between the level signal and a memory size; the manner of the configuration file is to add a configuration option to the basic input/output system and determine the size of the first part of the memory according to a received memory size that is input in the configuration option.

Alternatively, a size of the first part of the memory is determined using a preset memory slot, and a size of memory that corresponds to a memory slot powered on in a startup phase of the basic input/output system is the size of the first part of the memory.

After startup of the operating system is completed, in a subsequent further startup procedure, the operating system needs to further initialize the memory except the first part of the memory. If two or more processes need to occupy memory, it is needed to determine whether the memory initialized by the basic input/output system except the first part of the memory can satisfy requirements of process startup or loading. As an optional implementation manner, in this embodiment of the present disclosure, the operating system may further determine whether the memory that is further initialized satisfies a memory size required by a to-be-started process, and when a size of the memory that is further initialized does not satisfy the memory size required by the to-be-started process, wait for a preset time; and when the size of the memory that is further initialized satisfies a requirement of the to-be-started process, the operating system starts the to-be-started process. Further, when the size of the memory that is further initialized satisfies memory required by startup of two or more processes, a process with a higher priority is preferably started.

The memory startup method of a computer in this embodiment of the present disclosure is further described in detail below using specific examples.

At present, a commonly-used basic input/output system includes, but is not limited to, a BIOS, a UEFI BIOS, and a universal boot loader (uboot) that is used in an embedded system. In this embodiment of the present disclosure, a technical solution in which the UEFI BIOS is used as example for description.

Figure 2:
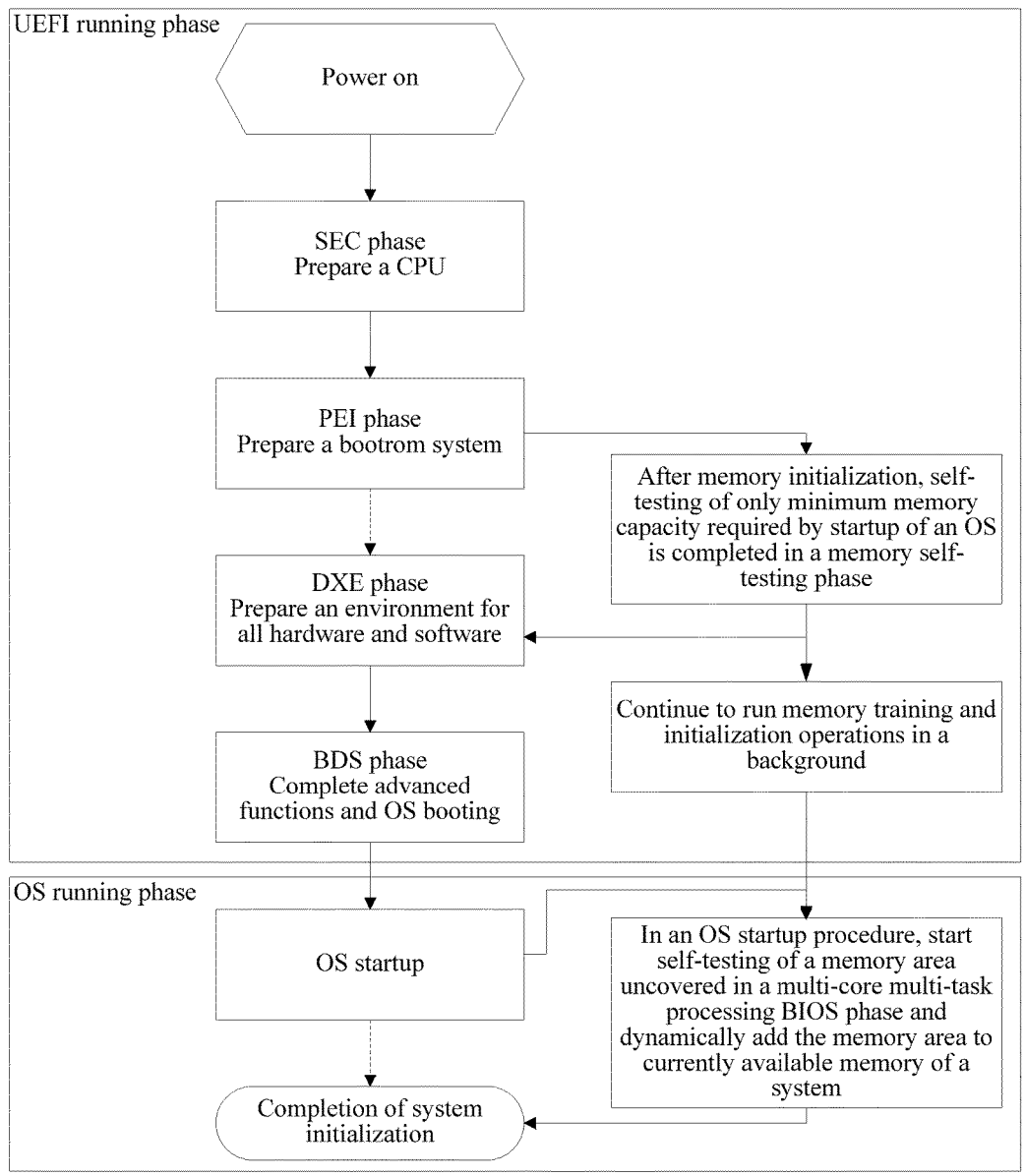
FIG. 2 is a flowchart of a memory startup method of a computer shown using a Unified Extensible Firmware Interface (UEFI) basic input/output system (BIOS) as an example according to an embodiment of the present disclosure.

FIG. 2 schematically shows a schematic flowchart of a specific implementation manner of a memory startup method of a computer according to an embodiment of the present disclosure using the UEFI BIOS as an example. This procedure is divided into two phases, that is, a UEFI BIOS running phase and an OS startup phase. Processing procedures of the two phases are described below in phases.

UEFI BIOS Running Phase

Figure 3:
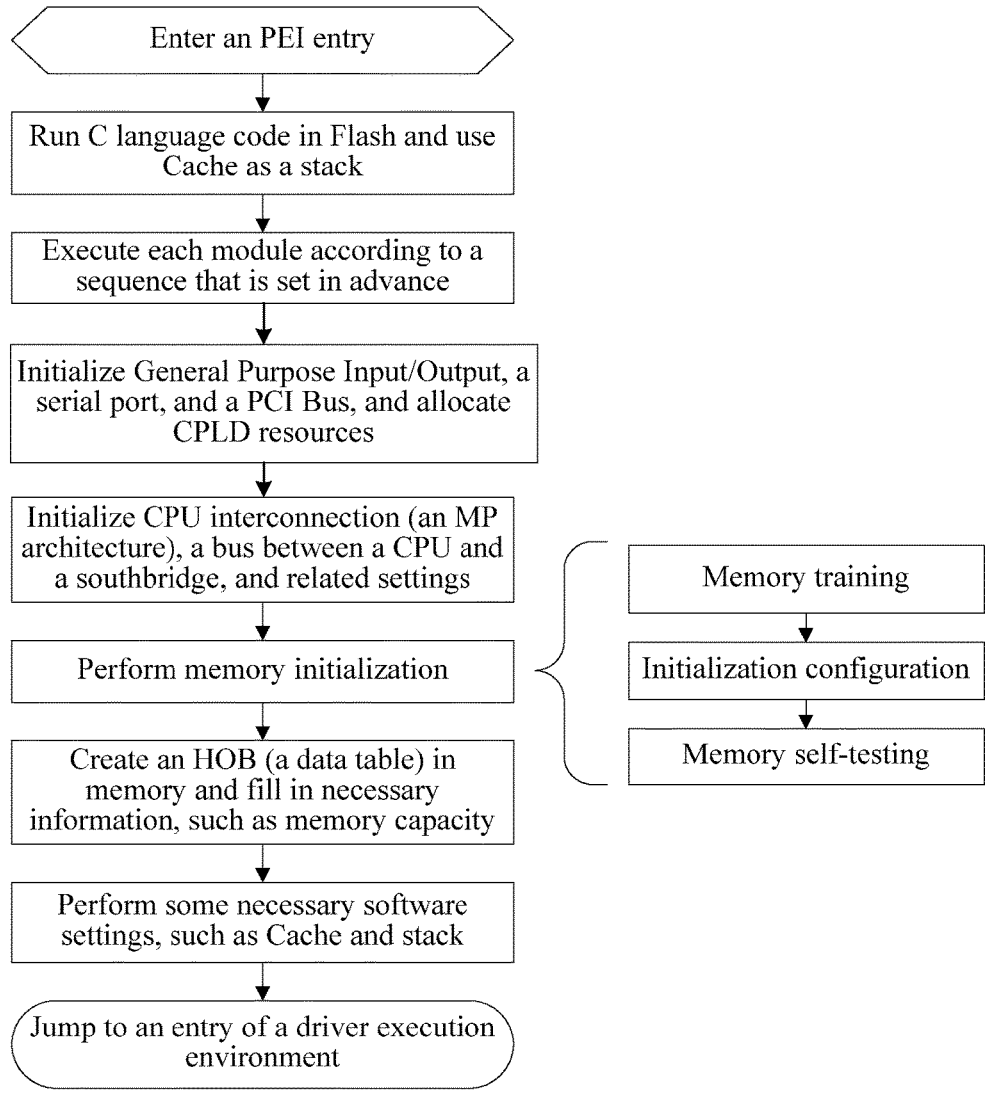
FIG. 3 is a schematic flowchart of transactions executed in a pre-initialization (PEI) phase according to an embodiment of the present disclosure.

In the UEFI BIOS, a procedure of testing and initializing memory is implemented in an Extensible Firmware Interface (EFI) PEI phase. This phase is mainly responsible for initialization preparation of basic hardware required by running of a system. FIG. 3 schematically shows transactions executed in the PEI phase, including running C language code in Flash, and using Cache as a stack; executing each module according to a sequence that is set in advance; initializing General Purpose Input/Output (GPIO), a serial port, and a peripheral component interconnect (PCI) Bus, and allocating complex programmable logic device (CPLD) resources; initializing CPU interconnection, a bus between a CPU and a southbridge, and related settings; performing memory initialization; creating a Hand-off Block (HOB) in memory, where the HOB refers to that, in an execution procedure of the PEI, a simple mechanism is provided for allocating memory for data storage, and an area used for data storage is referred to as the HOB, and filling in necessary information (such as a memory capacity) after the HOB is created; and further including performing some necessary software settings, such as Cache and stack, and then jumping to a driver execution environment (DXE). In the prior art, a procedure of testing and initializing memory is completed in this PEI phase. In this embodiment of the present disclosure, in the PEI phase, not all memory of a computer device is tested or initialized, only memory of a specified size is tested and initialized instead, and then other initialization transactions of the PEI phase continue to be executed. Memory that is not tested or initialized in the PEI phase is tested and initialized after the OS is started. For example, the BIOS notifies the OS in interruption system management interrupt (SMI) manner or in another optional manner, after receiving interruption of the BIOS, the OS continues to initialize memory that is initialized by the BIOS and adds the memory to available memory of the OS. For testing and initialization operations that should be performed by the BIOS, the BIOS continues to run the operations in the background.

For memory initialization of the foregoing PEI phase, a method for testing memory of a specified size may be implemented in the following manners.

Manner 1: A size of memory to be tested and initialized by a UEFI BIOS program is determined in a manner of a hardware signal or a configuration file.

For the manner of the hardware signal, a quantity of hardware signals may be determined on a circuit board that is connected to a memory. Each hardware signal has two states: a high level and a low level. The low level is represented by 0, and the high level is represented by 1. In an example, there are in total five signals on hardware to be read by the BIOS program. The five signals are represented by 5-bit data, and form a series of high and low levels in a manner such as a dual in-line package switch. After the BIOS program tests the five signals, the BIOS program queries a preset correspondence between the hardware signal and a size of the memory that needs to be tested, and determines a specific size of the memory that needs to be tested and initialized. For example, the preset correspondence between the hardware signal and a size of the memory that needs to be tested is, when 5 bits are all 1, indicating testing all memory; when only the first bit is 1, testing only memory of first 4 gigabyte (GB); when only the second bit is 1, testing only memory of first 8 GB; and the like. If bits, corresponding to actual hardware signals, tested by the BIOS are 10000, it is determined that the size of the memory that needs to be tested and initialized is 4 GB.

For the manner of the configuration file, a configuration file may be written into a startup menu of the BIOS (that is, a complementary metal-oxide semiconductor (CMOS) menu option), and a user configuration option is provided on a BIOS setting interface. A user may input, according to actual needs, a size of data that needs to be tested (for example, inputting 2048 represents testing first 2048 megabyte (MB) memory, and inputting 0 represents testing all memory). Before testing memory, the BIOS reads configuration information input by the user first, that is, the size of the memory to be tested, and then performs memory testing and initialization according to the received memory size input by the user.

Manner 2: A size of memory to be tested and initialized by a UEFI BIOS program is determined in a manner in which a hardware circuit sets a memory slot.

Power-on and power-off of the memory slot are controlled using the hardware circuit. In a startup phase of the BIOS program, only a powered-on memory slot is tested and initialized, so that the BIOS program tests and initializes memory of a specified size. In specific implementation, a group of printed board silk screens is used to represent a slot number of each memory. When the BIOS tests memory, the BIOS determines specific memory by identifying the slot number. For example, a position number J110 on a printed board represents the third memory module controlled by the CPU, and a size of memory to be tested and initialized is determined using the correspondence and a preconfigured memory slot that needs to be powered on for memory testing and initialization; the pre-configuration may be configuration performed by a user according to actual needs. At the very beginning of startup, the computer device powers on a memory unit needing to tested, and other memory slots are not powered on for the moment. After the BIOS tests memory of the powered-on slot, an OS startup phase is entered, and other memories are then powered on separately.

Figure 4:
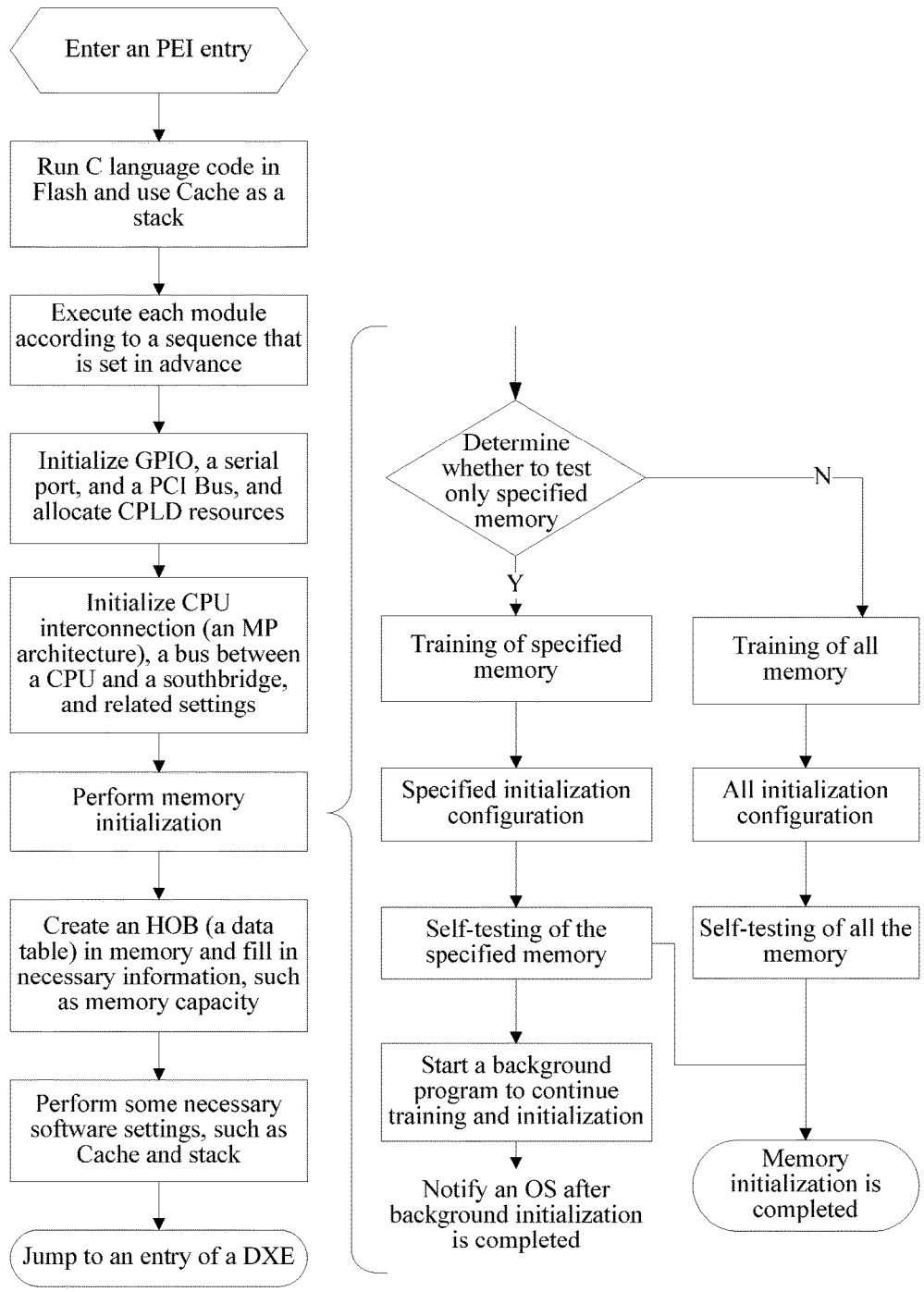
FIG. 4 is a schematic flowchart of a UEFI BIOS startup procedure according to an embodiment of the present disclosure.

The foregoing startup procedure of the UEFI BIOS may also be implemented with reference to the flowchart shown in FIG. 4, and no further details are described again.

After startup of the BIOS is completed, the computer device enters the OS startup phase. In this embodiment, a Linux operating system is used as an example for description.

When a bootloader of the UEFI BIOS phase boots up a Linux kernel, a kernel boot phase is entered, and this phase is mainly about a decompression procedure of two pieces of assembly code, that is, bootsect.S and setup.S. The bootsect.S is responsible for generating assembly source code of a boot sector, loading the setup.S and a system module into memory, and separately moving code of the bootsect.S and the setup.S into physical memory. The setup.S copies system parameters obtained from an interruption program of a read-only memory (ROM) BIOS into memory, so that the parameters are read later by code that is in a protection mode; moreover, the system module is loaded into a memory address; finally, after transferring a system into a protection mode, the setup.S then jumps to heads to decompress a kernel vmlinuz to the memory, and makes preparations for implementing memory management, such as initializing an interrupt descriptor and testing an address pin. Finally, a start_kernel calls an initialization function to complete settings of the kernel, and starts an init process of the system to complete startup of the whole system.

Figure 5:
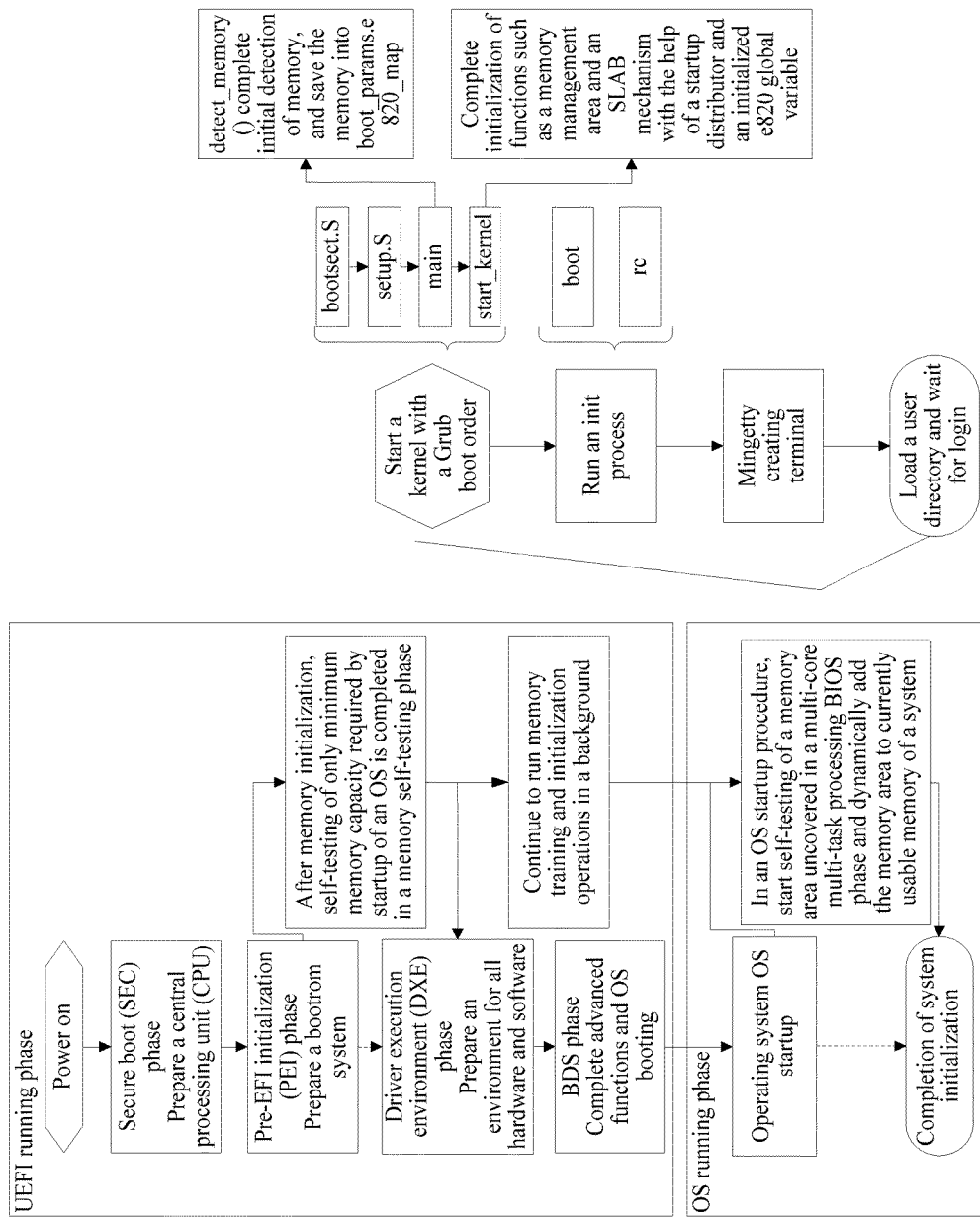
FIG. 5 shows a procedure of testing and initializing memory in a startup procedure of an operating system according to an embodiment of the present disclosure using a Linux operating system as an example.

Referring to FIG. 5, FIG. 5 shows a procedure of testing and initializing memory in a startup procedure of an operating system according to an embodiment of the present disclosure using a Linux operating system as an example. As shown in FIG. 5, a memory initialization phase in the startup procedure of the operating system is completed in a main function and a start_kernel, and procedures of the two are separately as follows.

The main function runs in a real mode, memory is detected and written into a global e820 table in the procedure, and only memory that has been initialized in a UEFI BIOS phase is detected. The e820 table is a memory distribution table obtained in a BIOS startup phase.

The start_kernel runs in a protection mode, and the memory detected by the main function is initialized, which includes, but is not limited to, allocation of memory space, division of usage areas, and the like.

For initialization of rest memory, memory testing and initialization may be implemented using a hot-swap technology at a logic level of a Linux kernel; or, further initialization may be performed by the OS after the UEFI BIOS performs testing and initialization in the background, so that the OS can use initialized memory.

After the UEFI BIOS performs testing and initialization in the background, the OS starts, according to a notification given by the BIOS program, initializing memory in an OS phase in a manner of a kernel thread or a kernel driver, and adds the memory to an available memory area of the system. For example, after initialization of the OS phase is completed, a monitoring process is started, for example, thread1; Thread1 determines whether memory of the computer device is totally initialized, and if there is a part of memory that is not initialized, the memory that is not initialized continues to be initialized. For example, the computer device has memory of 1 TB in total, but only memory of 4 GB is initialized, and rest memory of 6 GB needs to be initialized.

If there is memory that is not initialized by the OS, Thread1 may first determine whether the BIOS has new information about initialized memory to be reported; if yes, parse the reported information, including but not limited to a size of the memory and address information, and then perform basic configuration on the memory, including a self-testing procedure such as simple testing.

Thread1 calls a memory hot-swap interface of the system, and transmits the newly reported memory information to a system interface, and a memory hot-swap module adds new available memory to system resources according to the transmitted information. The memory hot-swap module depends on a function provided by the OS, for example, the memory hot-swap technology is supported after Linux 2.6.32.

Linux kernels of versions after 2.6.23 support memory hot-swap one after another. The memory hot-swap is classified as hot-swap at a physical level and hot-swap at a logic level. The memory hot-swap at a physical level must depend on necessary supports provided by hardware and firmware, to provide an environment of physical memory hot-swap. This embodiment of the present disclosure may use the hot-swap technology at a logic level, that is, a software manner is used to implement a procedure of adding memory that is initialized to available resources of the system.

If initialization of all memory is completed, for example, available memory of a computer device having memory of 1 GB in total is 1 T, the thread thread1 exits.

As an optional implementation manner, an embodiment of the present disclosure further provides a management mechanism for detecting available memory of a system and starting a process. After an operating system OS is started, all processes are started one after another according to a configuration file of the OS, and when currently available memory is not sufficient, a failure of process startup may be caused. This embodiment of the present disclosure further includes, after initialization of the operating system is completed, starting a memory control and testing management process, for example, a process thread2. Thread2 reads a specific configuration file, and the specific configuration file records processes that needs to be started and a size of memory required by the processes that needs to be started, so as to acquire a size of memory required by a to-be-started process. As an optional implementation manner, the specific configuration file may further include priorities of processes, so as to determine the to-be-started process. For example, a process A needs memory of 2 GB, and has a startup priority of 3; a process B needs memory of 4 GB, and has a startup priority of 1; a process C needs memory of 6 GB, and has a startup priority of 2. The process Thread2 determines a size of available memory of the current system according to information recorded by the configuration file, and determines, according to the size of available memory, processes that can be started. Assuming that currently available memory is 2 GB, according to the foregoing acquired information, the process A may be started, but the priority of the process A is 3, and therefore in an example in which a process with a smaller priority is started first, no process that satisfies a condition can be started in this case; the thread2 waits for a specific time and quires available memory of the current system again, and assuming that the available memory queried for the second time is 6 GB, a startup requirement of the process B is satisfied, then the process B is started. The thread2 waits again after the process B is started, and the process C and the process A are started in sequence according to a memory size.

For a case in which an operating system run in a computer device is a Windows operating system or a Uboot operating system, reference may be made to the implementation manner of the Linux operating system in the foregoing embodiments for implementation, and no further details are described again.

Figure 6:
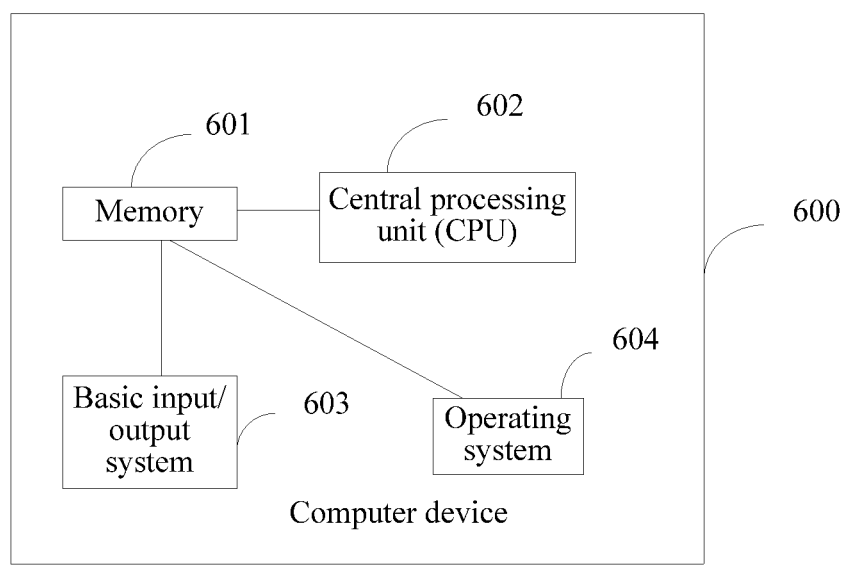
FIG. 6 is a schematic structural diagram of a computer device according to an embodiment of the present disclosure.

Referring to FIG. 6, FIG. 6 is a schematic structural diagram of a computer device 600 according to an embodiment of the present disclosure, including a memory 601 and a central processing unit 602, and a basic input/output system 603 and an operating system 604 that run in the computer device, where the basic input/output system 603 is configured to initialize only a first part of memory of the computer device in a memory initialization phase when the computer device is powered on and started, where the first part of the memory is a preset memory part of the memory of the computer device, and the first part of the memory that is initialized can satisfy a memory requirement for startup of an operating system that runs in the computer device; and continue to initialize memory, except the first part of the memory, of the memory of the computer after the operating system is started, and notify the operating system of the initialized memory except the first part of the memory; and the operating system 604 is configured to further initialize the memory, except the first part of the memory, of the memory of the computer device, and add the memory that is further initialized to available memory of the operating system.

For the foregoing computer device, after the computer is powered on and started, the basic input/output system 603 initializes only a first part of memory in a memory initialization phase, so that the operating system 604 can be started, and after the operating system 604 is started, the basic input/output system 603 continues to initialize memory that is not initialized in the computer, so that, in a startup phase, the computer can start the operating system without needing to wait until all memory has been initialized; therefore, a time from being started to entering the operating system is reduced for the computer, and a user can quickly enter the operating system to perform an operation, thereby improving user experience.

The further initializing, by the operating system 604, the memory, except the first part of the memory, of the memory of the computer includes starting, by the operating system 604, memory initialization of an operating system phase in a manner of a kernel thread or a kernel driver, and adding the initialized memory, except the first part of the memory, of the memory of the computer to the available memory of the operating system.

In the manner of the kernel thread or the kernel driver, after the operating system 604 is started, the operating system 604 further initializes the memory initialized by the basic input/output system 603, so that the memory that is further initialized can be used by the operating system 604, and memory requirements of some processes or additional functions are satisfied after the operating system 604 is started.

As an optional implementation manner, the operating system 604 is further configured to, after being started, further initialize the first part of the memory that is initialized by the basic input/output system, and add the first part of the memory that is further initialized to the available memory of the operating system. When the operating system 604 is a Linux operating system, the memory, except the first part of the memory, of the memory of the computer is initialized by a main function and a start_kernel function in the Linux operating system; memory that is initialized by a program of the basic input/output system is detected using the main function and is written into a global e820 table; and the start_kernel function is used to initialize a memory management area.

As an optional implementation manner, a size of the first part of the memory is set in a manner of a hardware signal or a configuration file, where the manner of the hardware signal is to set the size of the first part of the memory according to a level signal output by hardware and a preset relationship between the level signal and a memory size; the manner of the configuration file is to add a configuration option to the basic input/output system and determine the size of the first part of the memory according to a received memory size that is input in the configuration option. Alternatively, a size of the first part of the memory is determined using a preset memory slot, and a size of memory that corresponds to a memory slot powered on in a program startup phase of the basic input/output system is the size of the first part of the memory.

In an embodiment of the computer device of the present disclosure, the further initializing, by the operating system 604, the memory, except the first part of the memory, initialized by the basic input/output system 603 includes determining, by the operating system 604, whether the memory that is further initialized satisfies a memory size required by a to-be-started process, and when a size of the memory that is further initialized does not satisfy the memory size required by the to-be-started process, waiting for a preset time; and when the size of the memory that is further initialized satisfies a requirement of the to-be-started process, starting the to-be-started process. Optionally, when the operating system 604 further initializes the memory, except the first part of the memory, initialized by the basic input/output system 603, if the size of the memory that is further initialized satisfies memory required by startup of two or more processes, a process with a higher priority is preferably started.

For the implementation manner of the foregoing computer device, reference may be made to the specific implementation manners of the startup method of a computer in procedures shown in FIG. 2 to FIG. 5 for implementation, and no further details are described again.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present disclosure.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments of the present disclosure.

In addition, functional units in the embodiments of the present disclosure may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present disclosure essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or some of the steps of the methods described in the embodiments of the present disclosure. The foregoing storage medium includes any medium that can store program code, such as a universal serial bus (USB) flash drive, a removable hard disk, a ROM, a random access memory (RAM), a magnetic disk, or an optical disc.

The foregoing descriptions are merely specific embodiments of the present disclosure, but are not intended to limit the protection scope of the present disclosure. Any modification or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A memory startup method of a computer comprising a memory with a basic input/output system (BIOS), an operating system (OS), a first memory part, and a second memory part, wherein the memory startup method comprises:
    initializing, by the BIOS, the first memory part in a memory initialization phase to create an initialized first memory part when the computer is powered on and started, wherein the first memory part is a preset memory part, and wherein the initialized first memory part satisfies a memory requirement for startup of the OS;
    initializing, by the BIOS, the second memory part other than the first memory part after the OS is started to create an initialized second memory part;
    testing, by the BIOS, the initialized second memory part to create an initialized and tested second memory part;
    notifying, by the BIOS, the OS of the initialized and tested second memory part to instruct the OS to detect the initialized and tested second memory part;
    in response to the notification by the BIOS, further initializing, by the OS, the initialized and tested second memory part after completing startup of the OS to obtain a further initialized second memory part, wherein the OS does not retest the initialized and tested second memory part obtained by the BIOS prior to further initializing the initialized and tested second memory part, and wherein the further initialized second memory part is configured as available memory for use by the OS;
    adding the further initialized second memory part to the available memory for use by the OS;
    waiting for a preset time when a size of the further initialized second memory part does not satisfy a memory size required by a to-be-started process of the OS; and
    starting, by the OS, the to-be-started process when the size of the further initialized second memory part satisfies a requirement of the to-be-started process of the OS.

2. The memory startup method of claim 1, wherein further initializing, by the OS, the initialized second memory part comprises starting memory initialization of an OS phase in a manner of a kernel thread.

3. The memory startup method of claim 1, wherein further initializing, by the OS, the initialized second memory part, comprises starting, memory initialization of an OS phase in a manner of a kernel driver.

4. The memory startup method of claim 1, further comprising further initializing, by the OS, the first memory part of the memory after the OS is started.

5. The memory startup method of claim 1, wherein a first size of the first memory part is set in a manner of a hardware signal, and wherein the manner of the hardware signal sets the first size of the first memory part according to an output level signal from hardware and a preset relationship between the output level signal and a second size of memory to be initialized.

6. The memory startup method of claim 1, wherein a first size of the first memory part is set in a manner of a configuration file, wherein the manner of the configuration file is a configuration option to the BIOS, and wherein the first size of the first memory part is determined according to a received memory size that is input in the configuration option.

7. The memory startup method of claim 1, wherein a first size of the first memory part is determined using a preset memory slot, and wherein a second size of memory that corresponds to a memory slot powered on in a startup phase of the BIOS is the first size of the first memory part.

8. The memory startup method of claim 1, further comprising starting a process with a higher priority, wherein the size of the further initialized second memory part satisfies a memory requirement for startup of two or more processes.

9. The memory startup method claim 1, wherein the OS of the computer is a LINUX OS, and wherein the memory startup method further comprises:
    initializing, by the OS, the first memory part using a main function and a start_kernel function, wherein the OS detects, using the main function, the first memory part initialized by the BIOS, wherein the start_kernel function is used to initialize a memory management area; and writing, by the OS, the first memory part into a global e820 table.

10. A computer device, comprising a memory comprising a first memory part, a second memory part, and instructions;

a processor coupled to the memory and running an operating system (OS); and a basic input/output system (BIOS) coupled to the processor and the memory, wherein the BIOS is configured to:

initialize the first memory part in a memory initialization phase to create an initialized first memory part when the computer device is powered on and started, wherein the first memory part is a preset memory part, and wherein the initialized first memory part satisfies a memory requirement for startup of the OS;

initialize the second memory part other than the first memory part after the OS is started to create an initialized second memory part;

test, by the BIOS, the initialized second memory part to create an initialized and tested second memory part;

notify the OS of the initialized and tested second memory part to instruct the OS to detect the initialized and tested second memory part, wherein the OS is configured to:

in response to the notification by the BIOS, further initialize the initialized and tested second memory part after completing startup of the OS to create a further initialized second memory part, wherein the OS does not retest the initialized and tested second memory part created by the BIOS prior to further initialization of the initialized and tested second memory part, and wherein the further initialized second memory part is configured as available memory for use by the OS;

add the further initialized second memory part to the available memory for use by the OS;

wait for a preset time when a size of the further initialized second memory part does not satisfy a memory size required by a to-be-started process of the OS; and start the to-be-started process of the OS when the size of the further initialized second memory part satisfies a requirement of the to-be-started process of the OS.

11. The computer device of claim 10, wherein the OS is further configured to start memory initialization of an OS phase in a manner of a kernel thread.

12. The computer device of claim 10, wherein the OS is further configured to start memory initialization of an OS phase in a manner of a kernel driver.

13. The computer device of claim 10, wherein a first size of the first memory part is set in a manner of a hardware signal, and wherein the manner of the hardware signal sets the first size of the first memory part according to an output level signal from hardware and a preset relationship between the output level signal and a second size of the memory that is to be initialized.

14. The computer device of claim 10, wherein a first size of the first memory part is set in a manner of a configuration file, and wherein the manner of the configuration file is a configuration option to the BIOS and the first size of the first memory part is determined according to a received memory size that is input in the configuration option.

15. The computer device of claim 10, wherein a first size of the first memory part is determined using a preset memory slot, and wherein a second size of memory that corresponds to a memory slot powered on in a program startup phase of the BIOS is the first size of the first memory part of the memory.

16. The computer device of claim 10, wherein the OS is further configured to start a process with a higher priority, and wherein a size of the further initialized second memory part satisfies a memory requirement for startup of two or more processes.

17. The computer device of claim 10, wherein the OS is a LINUX OS, wherein the OS is configured to initialize the first memory part using a main function and a start_kernel function, wherein the start_kernel function is used to initialize a memory management area, and wherein the OS is configured to detect, using the main function, the first memory part initialized by a program of the BIOS.

* * * * *